(12) United States Patent
Minsek

(10) Patent No.: US 8,722,142 B2
(45) Date of Patent: May 13, 2014

(54) LIGHT INDUCED ELECTROLESS PLATING

(76) Inventor: David Minsek, New Milford, CT (US)

( * ) Notice: Subject to any disclaimer, the term of this patent is extended or adjusted under 35 U.S.C. 154(b) by 1090 days.

(21) Appl. No.: 12/549,547

(22) Filed: Aug. 28, 2009

(65) Prior Publication Data

US 2011/0052835 A1  Mar. 3, 2011

(51) Int. Cl.
B05D 3/00  (2006.01)

(52) U.S. Cl.
USPC .......................................................... 427/226

(58) Field of Classification Search
USPC .......................................................... 427/226
See application file for complete search history.

(56) References Cited

U.S. PATENT DOCUMENTS

| 4,126,524 | A | 11/1978 | Hradil et al. |
| 4,144,139 | A | 3/1979 | Durkee |
| 4,246,077 | A | 1/1981 | Hradil et al. |
| 4,251,327 | A | 2/1981 | Grenon |
| 5,322,553 | A | 6/1994 | Mandich et al. |
| 5,601,696 | A | 2/1997 | Asakawa |
| 5,882,435 | A | 3/1999 | Holdermann |
| 6,166,856 | A | 12/2000 | Araki et al. |
| 6,183,545 | B1 * | 2/2001 | Okuhama et al. ............ 106/1.18 |
| 6,251,249 | B1 | 6/2001 | Chevalier et al. |
| 7,109,056 | B2 * | 9/2006 | Klein .............................. 438/95 |
| 2004/0022934 | A1 | 2/2004 | Leung et al. |
| 2007/0151863 | A1 | 7/2007 | Morrissey |
| 2008/0035489 | A1 * | 2/2008 | Allardyce et al. ............ 205/263 |
| 2009/0120497 | A1 | 5/2009 | Schetty, III |

FOREIGN PATENT DOCUMENTS

WO  WO 2005/083799 A1  9/2005

* cited by examiner

Primary Examiner — Robert Vetere
(74) Attorney, Agent, or Firm — Carmody Torrance Sandak & Hennessey LLP

(57) ABSTRACT

A method and composition for plating metal contacts on photovoltaic solar cells is described. The cell is immersed in an aqueous bath containing platable metal ions and a chemical reducing agent. The cell is then exposed to light, causing the two sides of the cell to become oppositely charged. The metal ions are plated without requiring an external electrical contact, without backside anodic corrosion and without the need for backside sacrificial material.

14 Claims, 2 Drawing Sheets

LIGHT INDUCED ELECTROLESS PLATING

FIELD OF THE INVENTION

The present invention relates generally a method of electroless plating of metal contacts on photovoltaic cells, including silicon solar cells.

BACKGROUND OF THE INVENTION

Solar cells are photovoltaic cells or modules, which convert sunlight directly into electricity. Photovoltaic (PV) cells are made of semiconductor materials, most commonly silicon. When light (ultraviolet, visible and infrared radiation) strikes the cell, a certain portion of it is absorbed within the semiconductor material, such that the energy of the absorbed light is transferred to the semiconductor and an electrical current is produced. By placing metal contacts on the top and bottom of the PV cell, the current can be drawn off to use externally. The current, together with the cell's voltage, defines the wattage that the solar cell can produce.

A semiconductor photovoltaic cell comprises a large area p-n junction, where absorption of light results in the creation of electron-hole pairs. The electrons and holes migrate to opposite sides of the junction; such that excess negative charge accumulates on the n-doped side and excess positive charge accumulates on the p-doped side. In order for the current to be collected for power generation, electrical contact of both sides of the pn junction to an external circuit must be made. The contacts typically consist of a metallic pattern in ohmic contact with the device. The ideal contacting pattern will have high conductivity in order to minimize resistive losses, good electrical contact to the substrate in order to efficiently collect current, and high adhesion to ensure mechanical stability. The metal pattern is designed to provide a low resistance path for collecting current generated at any location on the surface of the cell and, simultaneously, to minimize the amount of incident radiation intercepted by the metal and thus lost for current generating purposes.

Silicon, especially in its crystalline form, is a common material used for producing solar cells. Most solar cells are made from crystalline silicon, doped with boron and phosphorus to produce a p-type/n-type junction. Polycrystalline silicon can be used in solar cell fabrication to cut manufacturing costs, although the resulting cells may not be as efficient as single crystal silicon cells. Amorphous silicon, which has no crystalline structure, may also used, again in an attempt to reduce production costs. Other materials used in solar cell fabricated include gallium arsenide, copper indium diselenide and cadmium telluride.

A typical arrangement of a silicon solar cell is as follows:
(a) a back contact;
(b) a P-type Si;
(c) an N-type Si;
(d) an antireflective coating;
(e) a contact grid; and
(f) a cover glass.

Because silicon is extremely reflective, an antireflective coating is typically applied to the top of the cell to reduce reflection losses. A glass cover plate is then typically applied over the antireflective layer to protect the cell from the elements.

Conventional solar cells may be made using crystalline silicon wafers. The Si (+4) wafer starts as a p-type with a boron (+3) dopant. To better capture light, the wafer may be texturized with hydroxide or nitric/hydrofluoric acids so that light is obliquely reflected into the silicon. The p-n junction is formed by diffusion using vapor deposition and a surface passivation layer is applied, again in vacuum equipment, to impart the silicon nitride film.

In one standard process of silicon solar cell fabrication, the front side of the silicon wafer is coated with an anti-reflective passivation layer, which is typically comprises silicon nitride. This silicon nitride layer serves the dual purpose of maximizing the percentage of light absorbed by the cell (not reflected), as well as passivating the surface, which prevents electron recombination at the surface and thus increases cell efficiency.

The solar cell contacts must be formed, whereby a full area metal contact is made on the back surface and a grid-like metal contact made up of fine "fingers" and larger "busbars" is formed on the front surface. After the solar cell conductors are formed, multiple solar cells are then interconnected in series (and/or parallel) by flat wires or metal ribbons, and assembled into modules or "solar panels." The finished solar panel product typically has a sheet of tempered glass on the front and a polymer encapsulation on the back to protect it from the environment.

Silicon is the most commonly used material for solar cell panel manufacturing. FIG. 1 shows the front side 10 having front side metal busbars 12 and metal lines 14 and the backside 20 having backside metal busbars 22 of a typical silicon solar cell. FIG. 2 shows a cross-sectional view of a typical silicon solar cell having an anti-reflective coating layer 32, an n-doped silicon layer 34 and a p-doped silicon layer 36. The silicon may be single crystalline or multicrystalline silicon, by way of example and not limitation. The metal lines 14 on the front side 10 collect the light-induced current. The front side busbars 12 collect current from the multiple metal lines 14 or "fingers." The backside 20 of the cell typically has a set of busbars 22 similar to the front side; however, the backside 20 does not need to allow for transmission of light. The front side busbars 12 and backside busbars 22 allow for the connection of cells in series for modules.

Competing factors must be considered in designing the front side metal pattern. The front side of the device must allow transmission of light so the metal traces should cover the smallest possible area in order to minimize shading losses. On the other hand, efficient current collection favors the coverage of the largest possible surface area since the sheet resistance of the front side may be relatively high (about 50 to 100Ω per square), leading to resistive losses if the coverage is too low.

A variety of methods may be used to form the metal pattern, including screen printing of conductive paste, ink jetting, and electroplating onto a seed layer. One commonly used method is screen printing of a silver paste containing a glass frit, followed by a firing step at about 800° C. during which the paste burns through the anti-reflective coating, if present. While this method provides conductive patterns with reasonably good electrical contact, conductivity and adhesion, performance could be further improved by the deposition of additional metal onto the conductive patterns.

In another method used to form a front side conductive pattern, metal is deposited from a solution of soluble metal ions onto a pattern of lines and busbars formed in the anti-reflective coating. A variety of methods may be used to form the pattern, such as photolithography followed by etching, mechanical scribing, or laser imaging. Such a method is described in International Publication No. WO 2005/083799.

Deposition of a metal from a solution of soluble metal ions occurs by an electrochemical mechanism, where oxidation and reduction reactions take place. Defined broadly, there are three different mechanisms for depositing metal on a substrate from solution:

(1) Displacement, also known as galvanic, deposition is where deposition of a metal on a less noble metal substrate is accompanied by transfer of electrons from the less noble to the more noble metal, resulting in deposition of the more noble metal and dissolution of the less noble metal substrate. However, this method is limited in that the deposit will be limited in thickness since deposition will stop when the less noble substrate is completely covered. Also a portion of the substrate will be consumed.

(2) Electrolytic plating is where oxidation and reduction are induced by means of an external source of electrical current. This method provides fast deposition rates that are not limited in thickness. However, an electrical connection must be made to the substrate.

(3) Autocatalytic, also known as electroless plating, deposition is where reduction of the metal ions is accomplished chemically by inclusion of a reducing agent in solution, where deposition only takes place on catalytically active surfaces. This method eliminates the need for an external power source. However, in practice this method suffers several drawbacks. Firstly, the process may be difficult to control since the solution is inherently thermodynamically unstable; spontaneous decomposition with precipitation of metal may occur unless great care is taken to optimize the system. This in turn limits deposition rates which may be very slow. In particular, autocatalytic silver plating solutions are well known in the art to be highly unstable.

To solve some of these problems, the prior art has suggested various methods of electroplating on photovoltaic devices utilizing, for example, light-induced voltage to effect metal deposition.

U.S. Pat. No. 4,144,139 to Durkee, the subject matter of which is herein incorporated in its entirety, describes a method for plating electrical contacts onto the surface of a solar cell by immersion of the cell in an electrolyte solution containing metal ions and exposing the surface of the solar cell to light such that plating of metal occurs on the anode surface of the device. The back (anodic) side is covered by a thick sacrificial layer of silver, such that silver dissolves from the anodic backside and deposits on the cathodic front side when the device is irradiated. A cyanide-containing silver plating solution is described. Although cyanide-containing silver electrolytes are well known to yield excellent plating results, the use of cyanide is not preferred due to safety as well as environmental considerations.

U.S. Pat. No. 4,251,327 to Grenon, the subject matter of which is herein incorporated by reference in its entirety, describes a method for plating similar to that described in U.S. Pat. No. 4,144,139. In addition, this patent describes an arrangement where the cathodic backside of the device is attached to the negative terminal of a DC power supply and the positive terminal is attached to a silver electrode in the solution, such that when the current is adjusted appropriately, neither deposition nor corrosion occurs on the backside. Again, a cyanide-containing silver plating solution is used. This arrangement is shown in FIG. 3.

U.S. Pat. No. 5,882,435 to Holdermann, the subject matter of which is herein incorporated by reference in its entirety, describes a process where a printed metallic front side pattern on a photovoltaic cell is reinforced by photo-induced deposition of a metal such as copper or silver. The back (anodic) side includes a printed sacrificial metal paste such that charge neutrality is maintained by dissolving of metal from the back side concurrent with deposition on the front side when the device is irradiated.

U.S. Patent Publication No. 2008/0035489 to Allardyce, the subject matter of which is herein incorporated by reference in its entirety, describes a method of plating electrical contacts on photovoltaic devices where the device is exposed to light while immersed in a silver plating solution comprising silver ions, at least one of a nitro-containing compound, a surfactant, an amino compound and at least one of either an amino acid or sulfonic acid. However, this "light induced plating method" for metallizing photovoltaic devices is the same or similar to the method described in the previously described U.S. Pat. Nos. 4,144,139 and 4,21,327 patents and suffers from the same deficiencies.

U.S. Patent Publication No. 200710151863 to Morrissey, the subject matter of which is herein incorporated by reference in its entirety, describes a non-cyanide silver electroplating composition comprising silver in the form of a complex with hydantoin or substituted hydantoin, an electrolyte, and 2,2'-dipyridyl.

U.S. Pat. No. 5,610,696 to Asakawa, the subject matter of which is herein incorporated by reference in its entirety, describes a cyanide-free silver electroplating bath containing silver in the form of a complex with hydantoin or substituted hydantoin.

U.S. Pat. No. 4,126,524 to Hradil et al., the subject matter of which is herein incorporated by reference in its entirety, discloses cyanide-free silver electroplating solutions containing silver complexed with imides of organic dicarboxylic acids, such as succinimide.

U.S. Pat. No. 4,246,077 to Hradil et al., the subject matter of which is herein incorporated by reference in its entirety, describes cyanide-free silver electroplating solutions containing silver complexed with pyrrolidine-2,5-dione (succinimide) or 3-pyrroline-2,5-dione (maleimide).

U.S. Pat. No. 5,322,553 to Mandich et al. the subject matter of which is herein incorporated by reference in its entirety describes a cyanide-free electroless silver plating solution comprising a silver cation, thiosulfate, and sulfite. This patent claims a plating rate and solution stability superior to conventional silver plating solutions.

Electroless silver plating also suffers from several deficiencies. For example, the baths are well known to be highly unstable with decomposition occurring readily, causing loss of silver due to precipitation and limited bath life. Also, plating rates are generally very slow under conditions necessary for suitable stability.

Faster plating rates can be obtained by electroplating, including light-induced plating as described in the prior art, in which an external power supply provides current to the devices. However, the attachment of an electrical connection can be problematic in that it can result in breakage of fragile silicon solar cells.

Therefore, it would be desirable to provide a plating method that is capable of the faster plating rates realized by electroplating without resulting in breakage of the silicon solar cells from the attachment of an electrical connection and that also minimizes the noted deficiencies of electroless silver plating.

The present invention addresses these deficiencies by using an electroless plating solution and method that includes a chemical reducer. The improved electroless plating solution of the invention is activated by light when used to plate metal on photovoltaic cells. No electrical contact with the device is necessary.

SUMMARY OF THE INVENTION

It is an object of the present invention to provide a method and compositions for plating metallic conductors onto photovoltaic devices by an autocatalytic process that includes a chemical reducer.

It is another object of the present invention to provide a method and compositions for plating metallic conductors onto photovoltaic devices by an autocatalytic process that is activated by light.

To that end, in one embodiment, the present invention relates generally to a composition for plating metal contacts on a photovoltaic solar cell, the composition comprising:
 a) a source of soluble silver ions; and
 b) a reducing agent.

In another embodiment, the present invention relates generally to a method of metallizing a photovoltaic solar cell to deposit a thick layer of metal thereon, said photovoltaic solar cell having a front side and a backside and said front side having a metallic pattern thereon, the method comprising the steps of:
 a) contacting the photovoltaic solar cell with an electroless plating composition comprising:
  i) a source of soluble silver ions; and
  ii) a reducing agent; and thereafter
 b) illuminating the photovoltaic solar cell with radiant energy from a light source,
wherein the front side and backside of the solar cell become oppositely charged and metal ions from the electroless plating solution are plated onto the metallic pattern on the frontside of the solar cell, whereby a thick layer of electroless metal is deposited thereon.

Using this method any metal may be deposited on the front side of the solar cell from an aqueous solution of its ions provided that the metal's reduction potential is greater than that of water. Preferred metals include copper and silver, especially silver, due to their high conductivity.

DETAILED DESCRIPTION OF THE PREFERRED EMBODIMENTS

Figure 1:
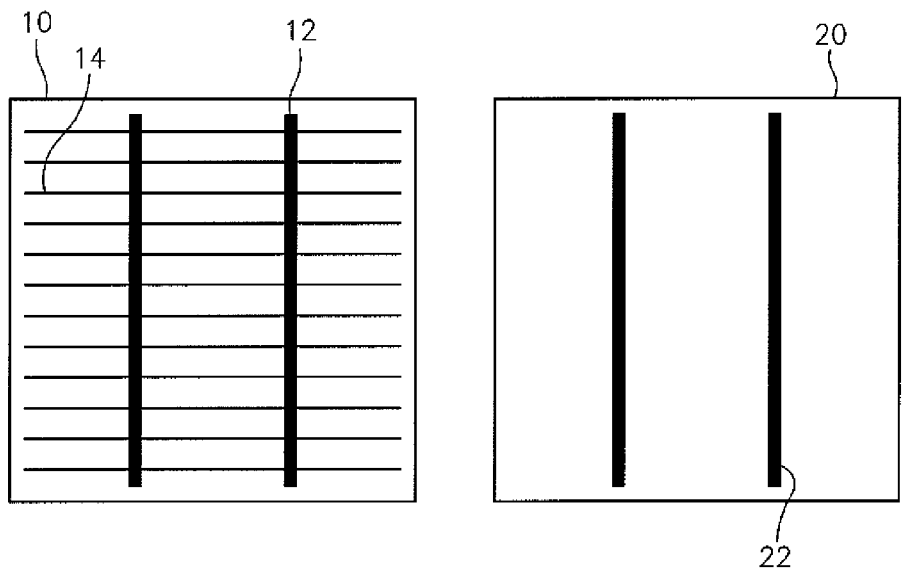
FIG. 1 shows a front side and a backside of a silicon solar cell.

The present invention relates generally to a method and compositions for plating metallic conductors onto photovoltaic devices by an autocatalytic process which is activated by light. The present invention includes a chemical reducer, which eliminates the need for either electrical contact or a sacrificial layer for plating the metallic conductors and at least substantially eliminates anodic corrosion from the backside of the photovoltaic device.

In one embodiment, the plating composition of the present invention includes:
 a) a source of soluble silver ions; and
 b) a reducing agent.

Almost any compound containing silver(I) can be used in the composition of the invention. The source of soluble silver ions may be silver oxide, silver nitrate, silver methanesulfonate, silver acetate, silver sulfate or any other silver salt, by way of example and not limitation. In one embodiment, the source of soluble silver ions is preferably silver acetate or silver methanesulfonate. In a preferred embodiment the source of soluble silver ions is present in the electroless plating composition of the invention at a concentration of about 15 to about 35 grams/liter.

The at least one reducing agent may include formaldehyde, glucose, dextrose, glyoxal, sugar inverted by nitric acid, hydrazine or hydrazine sulfate, aldonic acids, aldonic lactones, tartrate salts (also known as "Rochelle's salts"), cobalt ions, sulfide salts, sulfite salts, thiosulfate salts, hypophosphite salts, borohydride salts, dimethylamine or other alkylamine borane, hydrazineborane, cyanoborohydride salts, by way of example and not limitations. Other reducing agents known in the art would also be usable in the present invention. In one embodiment, the reducing agent is a Rochelle salt or a glyoxal or salt thereof. In a preferred embodiment, the at least one reducing agent is present in the electroless plating composition of the invention at a concentration of about 15 to about 60 grams/liter.

An optional complexing agent may be added to solubilize and stabilize the silver cation and sequester metallic impurities that may be presenting. Known silver complexors include cyanide, succinimide or substituted succinimides, hydantoin or substituted hydantoins, uracil, thiosulfates and amines, by way of example and not limitation. In one embodiment, the complexing agent is hydantoin or substituted hydantoin. If used, the complexing agent may be present in the electroless plating composition at a concentration of about 40 to about 80 grams/liter.

Finally, the composition of the invention may also include various surface active agents, grain refiners and surfactants. For example, polyethyleneimine, polyethylene glycol, 2,2'-dipyridyl, and thiourea may be added to the composition of the invention by way of example and not limitation.

The pH of the solution is preferably adjusted to between about 7.5 and 9.5 using a suitable pH adjuster. Potassium hydroxide or sodium hydroxide, by way of example and not limitation, may be used to adjust the pH of the solution.

Figure 4:
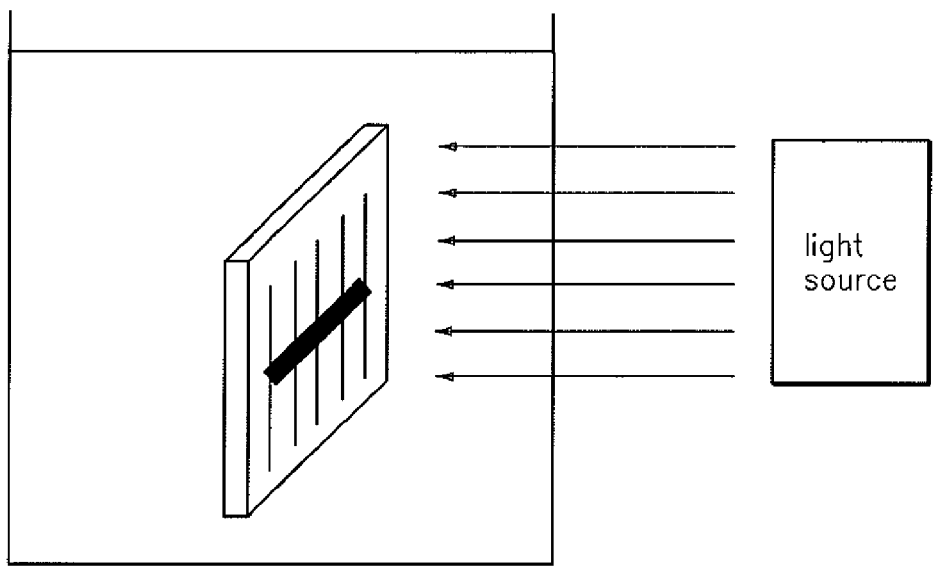
FIG. 4 shows an embodiment of a light-induced electroless plating process in accordance with the present invention.

As illustrated in FIG. 4, the present invention relates generally to a method of metallizing a photovoltaic solar cell to deposit a layer of metal thereon, said photovoltaic solar cell having a front side and a backside and said front side having a metallic pattern thereon, the method comprising the steps of:
 a) contacting the photovoltaic solar cell with an electroless plating composition comprising:
  i) a source of soluble silver ions; and
  ii) a reducing agent; and thereafter
 b) illuminating the photovoltaic solar cell with radiant energy from a light source,
wherein the front side and backside of the solar cell become oppositely charged and metal ions from the electroless plating solution are plated onto the metallic pattern on the frontside of the solar cell, whereby a layer of electroless metal is deposited thereon.

As discussed above, the metallic pattern on the front side of the solar cell generally comprises a plurality of current collection lines and busbars.

The light source of the invention is positioned to illuminate the photovoltaic solar cell with radiant energy. Various light sources can be used in the practice of the invention, including, for example quartz halogen lamps, incandescent lamps and mercury lamps.

The step of contacting the photovoltaic cell with the electroless plating composition typically comprises immersing the photovoltaic cell in the electroless plating composition. In the practice of this invention no electrical contact to an external power source is required. Further sacrificial dissolution of metal from the device is also not required.

While not wishing to be bound by theory, the inventors believe that there are two possible mechanisms for light-activated reduction of a metal ion on the cathode. Firstly, an electron may be donated to a metal cation directly from the cathode, causing the deposition of the metal atom on the cathode. The residual positive charge remains on the anode which is the backside of the cell, where it can react with the reducer, Alternatively, the cathode catalyzes the donation of an electron from the chemical reducer to the metal, resulting in the deposition of the metal ion on the cathode. A combination of these two mechanisms may also be occurring. The result of either mechanism is the same, namely, light-induced deposition of metal occurs selectively onto a metal cathode, without attachment of external electrical contacts and without anodic corrosion on the backside.

EXAMPLES

Example 1

A solution was made as follows:

| | |
|---|---|
| 72.6 grams/liter | 5,5-dimethylhydantoin |
| 20.2 grams/liter | silver acetate |
| 14.0 grams/liter | potassium methanesulfonate |
| 30.0 grams/liter | sodium potassium tartrate ("Rochelle salt") |

KOH was added to make pH = 9.1

KOH was added to make pH=9.1

Example 2

A solution was made as follows:

| | |
|---|---|
| 72.6 grams/liter | 5,5-dimethylhydantoin |
| 20.2 grams/liter | silver acetate |
| 18.2 grams/liter | glyoxylic acid hydrate |
| 72.7 grams/liter | potassium methane sulfonate |

NaOH was added to make pH = 9.2

NaOH was added to make pH-9.2

Example 3

A solution was made as follows:

| | |
|---|---|
| 48.0 grams/liter | hydantoin |
| 10.3 grams/liter | methanesulfonic acid |
| 32.0 grams/liter | boric acid |
| 28.7 grams/liter | silver methanesulfonate |
| 54.0 grams/liter | glyoxylic acid hydrate |

KOH was added to make pH = 8.8

KOH was added to make pH=8.8

Comparative Example 1

For comparison, a solution was made without a reducer as follows:

| | |
|---|---|
| 72.6 grams/liter | 5,5'-dimethylhydantoin |
| 20.2 grams/liter | silver acetate |

NaOH was added to make pH = 9.1

NaOH was added to make pH=9.1

Figure 2:
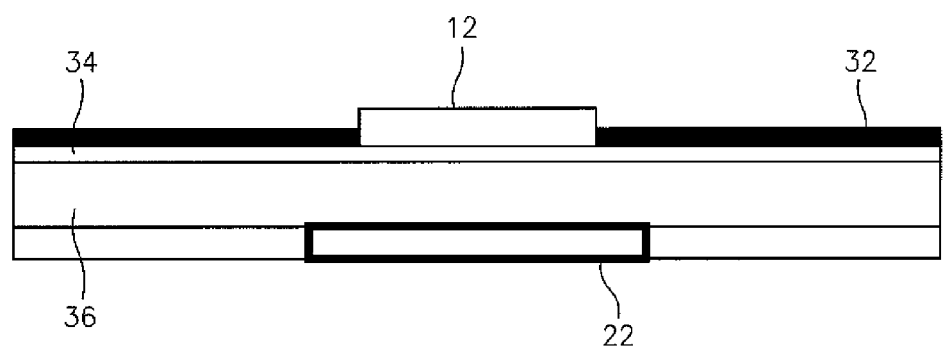
FIG. 2 shows a cross-sectional view of a silicon solar cell.
Figure 3:
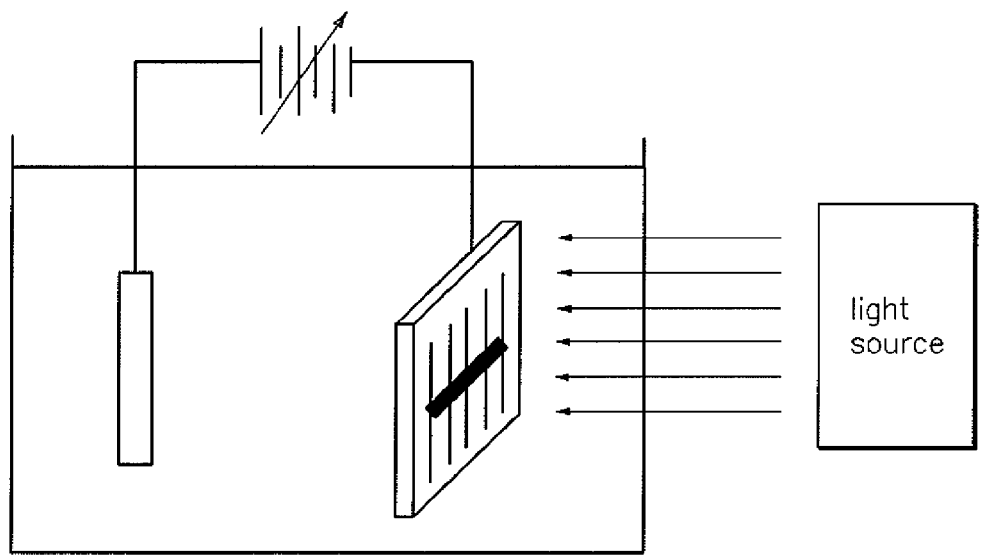
FIG. 3 shows an embodiment of a prior art light-induced electrolytic plating process.

Solar cells as illustrated in FIGS. 1 and 2 were plated with these solutions. The lines on the front side consisted of printed silver paste and were an average of about 82 microns width as measured by a top-down optical microscope. The busbars on the backside consisted of printed silver paste and were a thickness of about 4.5 microns as measured by X-ray fluorescence (XRF).

The solutions were heated to 45° C. in a clear glass beaker. Solar cell pieces were immersed for 8 minutes while irradiating the front side using a 250 W lamp from a distance of about 5 inches. The cells were then rinsed with deionized water and dried. The post-processing line widths were measured by a top-down optical microscope and the backside busbar thicknesses were measured b XRF.

It can be seen that a large increase in line width occurred for Examples 1 and 2 while there is no increase in line width for Comparative Example 1.

Table 1 shows the results for front side line width and backside busbar thickness measurements using optical microscopy and XRF respectively.

TABLE 1

| | Front side line width (microns) | Backside busbar thickness (microns) |
|---|---|---|
| Control | 82 | 4.5 |
| Example 1 | 117 | 5.1 |
| Example 2 | 98 | 5.6 |
| Example 3 | 92 | 3.8 |
| Comparative Example 1 | 81 | 2.8 |

It is observed that there are large increases in front side line widths for Examples 1-3, while Comparative Example 1 shows no increase. In addition, there is a net increase in backside silver busbar thickness for Examples 1-3, while Comparative Example 1 shows a net decrease, indicating that anodic corrosion of the busbar occurs when no reducer is present in the solution.

What is claimed is:

1. A method of metalizing a photovoltaic solar cell to deposit a layer of metal thereon, said photovoltaic solar cell having a front side and a backside and said front side having a pattern comprising metal thereon, the method comprising the steps of:
   a) contacting the photovoltaic solar cell with an electroless plating composition comprising:
      i) a source of soluble silver ions; and
      ii) a complexing agent for silver ions selected from the group consisting of cyanide, succinimide or substituted succinimide, hydantoin or substituted hydantoin, uracil, thiosulfate, amines and combinations of one or more of the foregoing;
      iii) a reducing agent selected from the group consisting of formaldehyde, glucose, dextrose, glyoxal, sugar inverted by nitric acid, hydrazine or hydrazine sulfate, aldonic acids, aldonic lactones, Rochelle's salts, cobalt ions, sulfide salts, sulfite salts, thiosulfate salts, hypophosphite salts, borohydride salts, alkylamine borane, hydrazineborane, cyanoborohydride salts and combinations of one or more of the foregoing; and thereafter b) illuminating the photovoltaic solar cell with radiant energy from a light source, wherein the frontside and backside of the solar cell become oppositely charged and metal ions from the electroless plating solution are plated onto the metallic pattern on the frontside of the solar cell, and wherein the solar cell is not electrically connected to an external power source during the plating.

2. The method according to claim 1, wherein the source of soluble silver ions is selected from the group consisting of silver oxide, silver nitrate, silver methanesulfonate, silver acetate, silver citrate, silver sulfate and combinations of one or more of the foregoing.

3. The method according to claim 2, wherein the source of soluble silver ions is silver acetate.

4. The method according to claim 2, wherein the source of soluble silver ions is silver methanesulfonate.

5. The method according to claim 1, wherein the concentration of the source of soluble silver ions is between about 15 and about 35 grams/liter.

6. The method according to claim 1, wherein the reducing agent is a Rochelle salt.

7. The method according to claim 1, wherein the reducing agent is glyoxal or a salt thereof.

8. The method according to claim 1, wherein the concentration of the reducing agent is between about 15 and about 60 grams/liter.

9. The method according to claim 1, wherein the complexing agent is hydantoin or substituted hydantoin.

10. The method according to claim 1, wherein the concentration of the complexing agent is between about 40 and about 80 grams/liter.

11. The method according to claim 1, wherein the pattern comprising metal on the front side of the solar cell comprises current collection lines and busbars printed thereon.

12. The method according to claim 11, wherein the pattern comprising metal comprises printed silver paste.

13. The method according to claim 1, wherein the light source is a selected from the group consisting of quartz halogen lamps, incandescent lamps and mercury lamps.

14. The method according to claim 1, wherein the step of contacting the photovoltaic cell with the electroless plating composition comprises immersing the photovoltaic cell in the electroless plating composition.

* * * * *